(12) United States Patent
Hsiao et al.

(10) Patent No.: US 7,639,064 B2
(45) Date of Patent: Dec. 29, 2009

(54) DRIVE CIRCUIT FOR REDUCING INDUCTIVE KICKBACK VOLTAGE

(75) Inventors: Ko Hsiao, Chengdu (CN); Chiang Sun, Chengdu (CN)

(73) Assignee: Eutech Microelectronic Inc., Taipei (TW)

( * ) Notice: Subject to any disclaimer, the term of this patent is extended or adjusted under 35 U.S.C. 154(b) by 0 days.

(21) Appl. No.: 12/017,070

(22) Filed: Jan. 21, 2008

(65) Prior Publication Data

US 2009/0184738 A1    Jul. 23, 2009

(51) Int. Cl.
*H03K 17/56* (2006.01)
(52) U.S. Cl. ........................ 327/423; 327/108
(58) Field of Classification Search ............... None
See application file for complete search history.

(56) References Cited

U.S. PATENT DOCUMENTS

| | | | | |
|---|---|---|---|---|
| 5,990,640 A | * | 11/1999 | Dwyer et al. | 318/400.29 |
| 6,534,967 B1 | * | 3/2003 | Weggel | 324/127 |
| 6,977,533 B2 | * | 12/2005 | Kernhof et al. | 327/110 |
| 7,477,082 B2 | * | 1/2009 | Fukazawa | 327/108 |
| 2004/0036435 A1 | * | 2/2004 | Berroth et al. | 318/439 |
| 2004/0207453 A1 | * | 10/2004 | Kernhof et al. | 327/424 |
| 2006/0176007 A1 | * | 8/2006 | Best | 318/685 |
| 2008/0116752 A1 | * | 5/2008 | Kuroda et al. | 307/125 |
| 2009/0014791 A1 | * | 1/2009 | Anderson et al. | 257/337 |
| 2009/0018388 A1 | * | 1/2009 | Forsell | 600/40 |
| 2009/0046482 A1 | * | 2/2009 | Smith | 363/17 |

* cited by examiner

*Primary Examiner*—Tuan Lam
*Assistant Examiner*—Hiep Nguyen

(57) ABSTRACT

In one embodiment a drive circuit includes two comparators which are adapted to sense kickback voltage generated in an inductive load and conduct two field-effect transistors connected to ground in a very short period of time so as to quickly reduce the kickback voltage to a minimum value. In another embodiment only one comparator is provided.

4 Claims, 13 Drawing Sheets

DRIVE CIRCUIT FOR REDUCING INDUCTIVE KICKBACK VOLTAGE

BACKGROUND OF THE INVENTION

1. Field of Invention

The invention relates to kickback voltage reduction circuits and more particularly to a drive circuit incorporating one or two comparators adapted to sense kickback voltage generated in an inductive load and conduct two field-effect transistors connected to ground in a very short period of time so as to quickly reduce the kickback voltage.

2. Description of Related Art

Many inductive load drive systems for disk drive, fan motor drive or the like employ a drive circuit for reducing kickback voltage generated therein. A kickback voltage is generated when a current flowing through an inductive load is suddenly changed. The kickback voltage can apply to the drive system (i.e., circuit) to undesirably increase power consumption.

FIG. 1 shows a conventional drive circuit 5 for reducing kickback voltage generated in an inductive load. The circuit 5 comprises an H-shaped transistor assembly 1 including transistors (e.g., field-effect transistors (FETs)) 111, 112, 121, 122 and diodes 131, 132, 133, 134 in which the transistor 111 and the diode 131 are controlled by a logic control 211, the transistor 112 and the diode 132 are controlled by a logic control 212, the transistor 121 and the diode 133 are controlled by a logic control 221, and the transistor 122 and the diode 134 are controlled by a logic control 222 respectively. The circuit 5 operates as follows:

In FIG. 2, initially current I flows from the transistor 121 to the transistor 112 via an output OUT1, an inductive load (i.e., direct current motor) 3, and an output OUT2 when the transistor 121 is conducted by the logic control 221, the transistor 112 is conducted by the logic control 212, the transistor 122 is cut off by the logic control 222, and the transistor 111 is cut off by the logic control 211 respectively.

In FIG. 3, just before phase change recirculation current I flows from the transistor 111 to the transistor 112 via the output OUT1, the load 3, and the output OUT2 when the transistor 121 is cut off by the logic control 221, the transistor 112 is conducted by the logic control 212, the transistor 122 is cut off by the logic control 222, and the transistor 111 is conducted by the logic control 211 respectively.

In FIG. 4, recirculation current I flows from the transistor 111 to the transistor 122 via the output OUT1, the load 3, and the output OUT2 when phase changes when the transistor 121 is cut off by the logic control 221, the transistor 112 is cut off by the logic control 212, the transistor 122 is cut off by the logic control 222, and the transistor 111 is conducted by the logic control 211 respectively.

There is no additional component for directing current flowing from internal power source PVCC to ground GND other than a Zener diode 43 and a capacitor 42. In detail, current I will only flow from the capacitor 42 to ground if no Zener diode is provided. It is typical for the capacitor 42 having a small capacity. Thus, it is impossible for the capacitor 42 to store all electric charge discharged by the load 3. This in turn may direct the electric charge not stored by the capacitor 42 to both PVCC and OUT2. As a result, voltage of each of PVCC and OUT1 increases abruptly. This is called kickback voltage. Also, voltage difference between two terminals of the capacitor 42 increases continuously as voltage of each of PVCC and OUT1 continues to increase. Hence, the capacitor 42 can store more electric charge. Eventually, the capacitor 42 stores all electric charge discharged by the load 3.

However, the kickback voltage may exceed the maximum voltage allowed by other components of the circuit 5, resulting in a damage to these components.

Voltage of OUT1 or OUT2 will increase as kickback voltage is generated. Eventually, the diodes 133, 134 are conducted to maintain the current flow from OUT2 to OUT1 via the load 3. Additionally, a Schottky Barrier Diode (SBD) 41 is provided to interconnect power supply VCC and PVCC. The provision of SBD can prevent reverse current from damaging VCC.

The graph of FIG. 11 corresponds to the addition of the SBD 41. In detail, the upper graph represents the curve of VCC. The intermediate graph represents the curve of PVCC when kickback voltage is generated. The lower graph represents the curve of OUT1 or OUT2 when the SBD 41 enables to clamp down the voltage of OUT1 or OUT2 in response to kickback voltage. As a result, the voltage level of OUT1 or OUT2 decreases greatly. This has the benefit of preventing VCC from being adversely affected by kickback voltage.

In addition, a Zener diode 43 is added to interconnect PVCC and ground GND. The increasing kickback voltage will increase voltage of OUT1 or OUT 2 and also make the Zener diode 43 to break down reversely. As a result, electric charge not stored by the capacitor 42 will be directed to GND via the Zener diode 43 and voltage of OUT1 or OUT2 will be clamped to a predetermined level.

The graph of FIG. 12 corresponds to the addition of the Zener diode 42. In detail, the upper graph represents the curve of VCC. The intermediate graph represents the curve of PVCC when kickback voltage is generated. The lower graph represents the curve of OUT1 or OUT2 when the Zener diode 42 enables to clamp down the voltage of OUT1 or OUT2 in response to kickback voltage. As a result, the voltage level of kickback voltage decreases greatly. This has the benefit of protecting other components of the circuit 5.

However, it is not always possible of integrating a Zener diode in a chip because many semiconductor manufacturing processes do not support such technology. For allowing large current to pass a Zener diode, the Zener diode is required to occupy a large area of a chip. This can result in an increase in the chip manufacturing cost. Moreover, a power supply VCC is available to have a wide range of voltage from about 2V to about 200V. Typically, two rules should be followed when selecting a power supply VCC as detailed below.

First rule: Reverse-breakdown voltage of a Zener diode should be higher than the maximum voltage of power supply VCC. Second rule: Reverse-breakdown voltage of a Zener diode should be lower than the maximum voltage allowed by other components of a circuit.

The first rule aims at preventing a power supply VCC from being reverse-breakdown. Otherwise, a quiescent current of a circuit may be adversely affected. The second rule aims at protecting other components in the circuit when kickback voltage is generated.

The conventional drive circuit 5 for reducing kickback voltage functions based on different voltage levels of power supply VCC and operating voltages of other components in the circuit. Also, the addition of a Zener diode has the drawbacks of greatly increasing the chip manufacturing cost.

There have been numerous suggestions in prior patents for kickback voltage reduction circuit. For example, U.S. Pat. No. 5,896,117 discloses such a circuit. Thus, continuing improvements in the exploitation of inductive kickback voltage reduction circuit are constantly being sought.

SUMMARY OF THE INVENTION

It is therefore one object of the invention to provide a drive circuit comprising two comparators which are adapted to sense kickback voltage generated in an inductive load and conduct two field-effect transistors connected to ground in a very short period of time so as to quickly reduce the kickback voltage to a minimum value. The invention can also reduce chip size.

It is another object of the invention to provide a drive circuit comprising a comparator which is adapted to sense kickback voltage generated in an inductive load and conduct two field-effect transistors connected to ground in a very short period of time so as to quickly reduce the kickback voltage to a minimum value. The invention can also reduce chip size.

The above and other objects, features and advantages of the invention will become apparent from the following detailed description taken with the accompanying drawings.

DETAILED DESCRIPTION OF THE INVENTION

Figure 1:
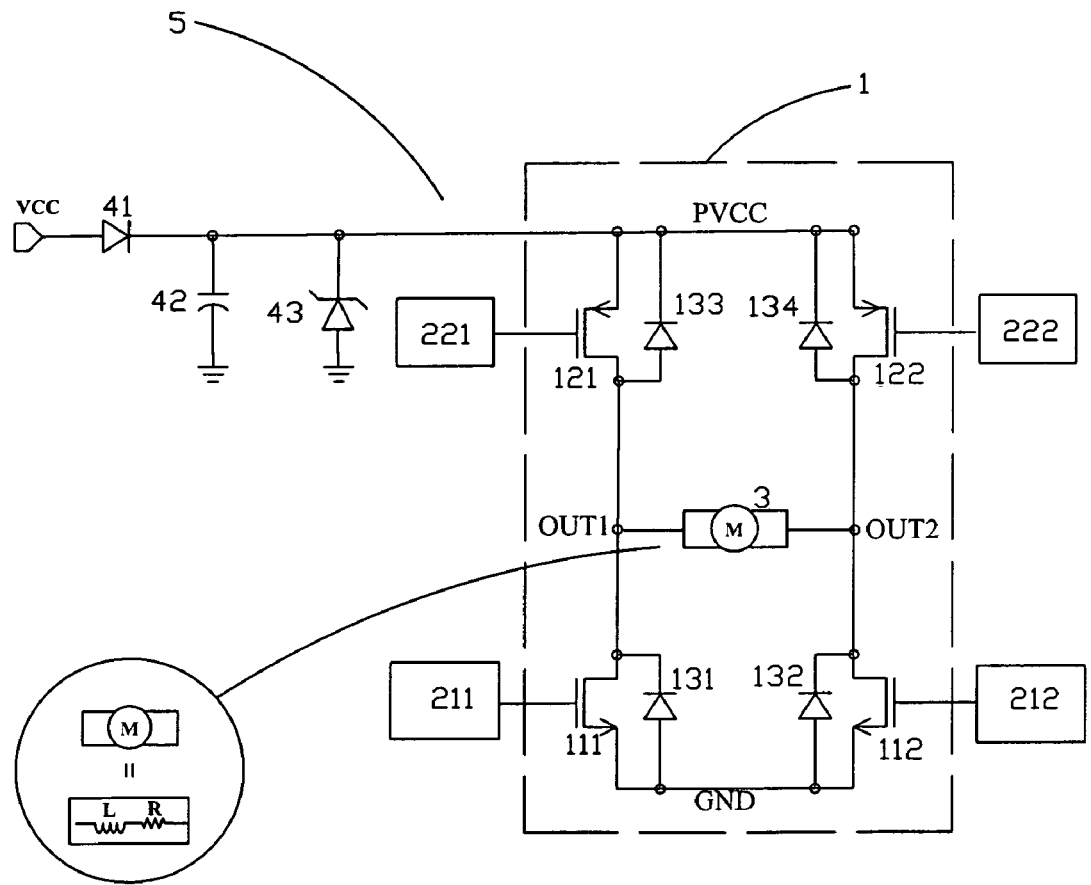
FIG. 1 is a circuit diagram of a conventional inductive kickback voltage reduction circuit.
Figure 2:
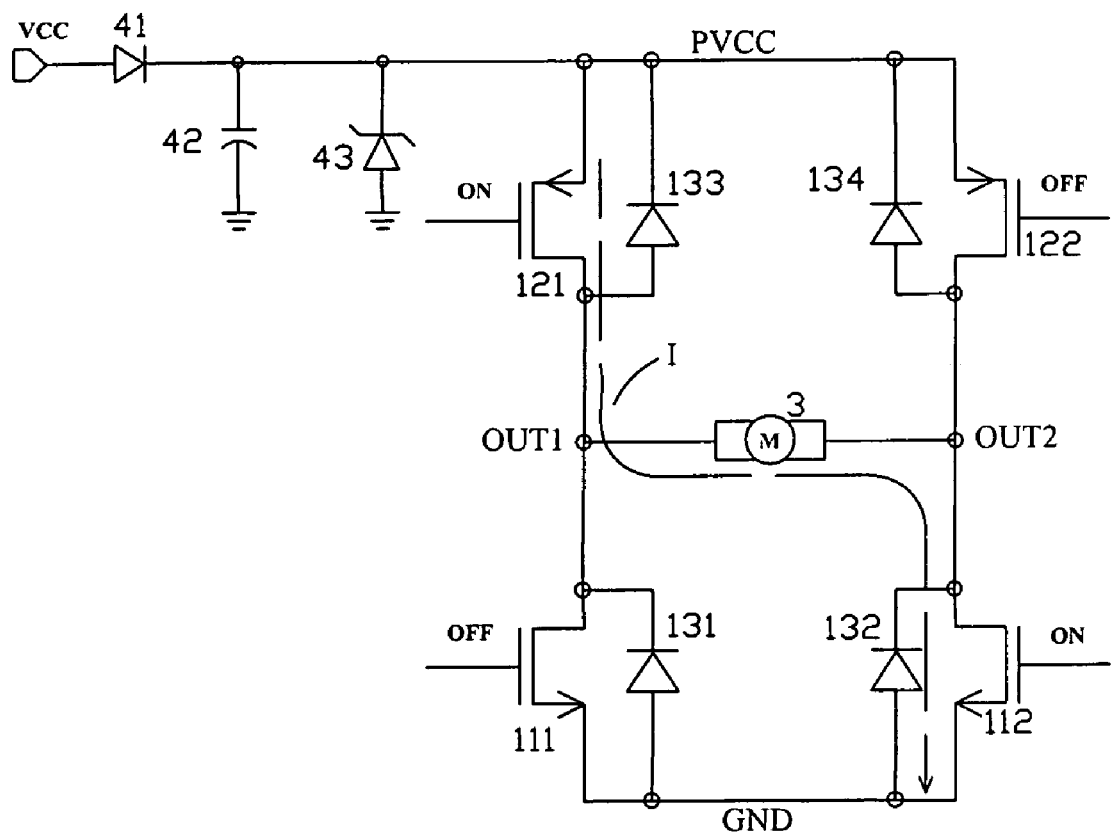
FIG. 2 shows current flowing from a third transistor to a second transistor via OUT1, load (i.e., direct current motor), and OUT2 when both second, third transistors are on and both fourth, first transistors are off in the circuit of FIG. 1.
Figure 3:
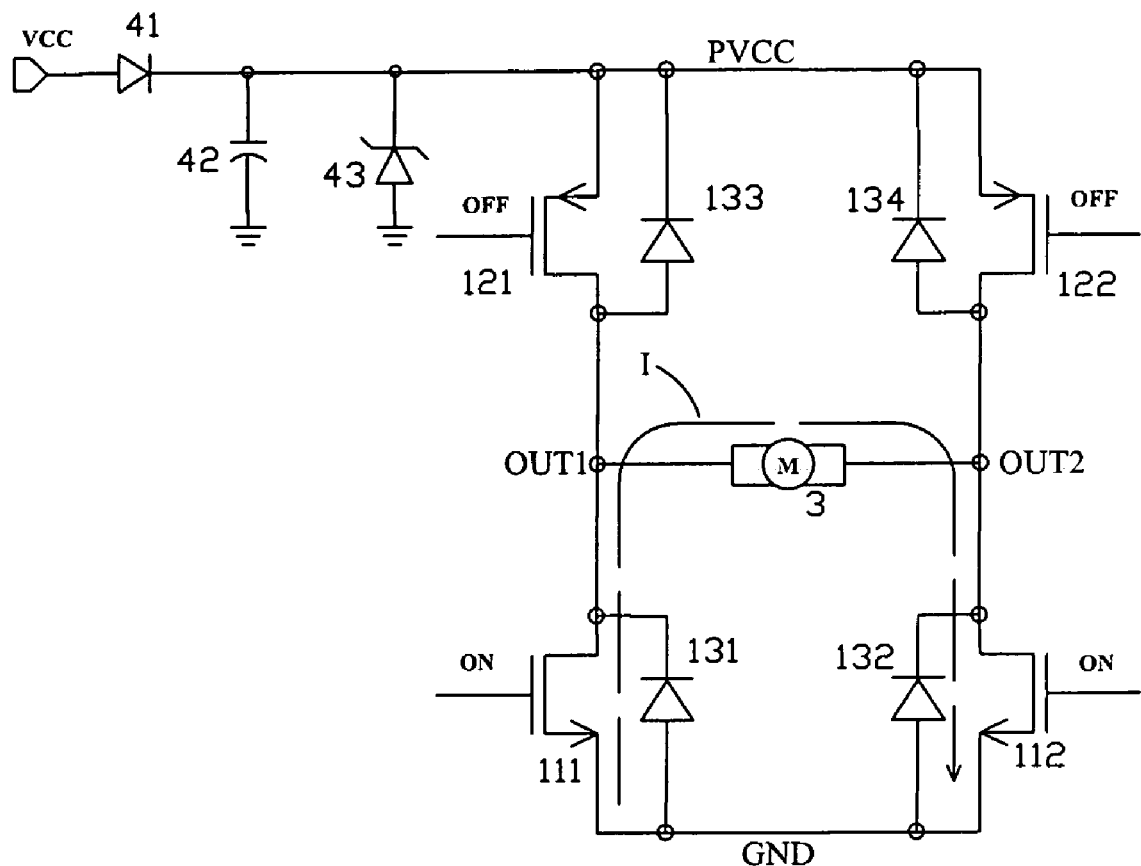
FIG. 3 shows current flowing from a first transistor to a second transistor via OUT1, load, and OUT2 when both first, second transistors are on and both third, fourth transistors are off in the circuit of FIG. 1.
Figure 4:
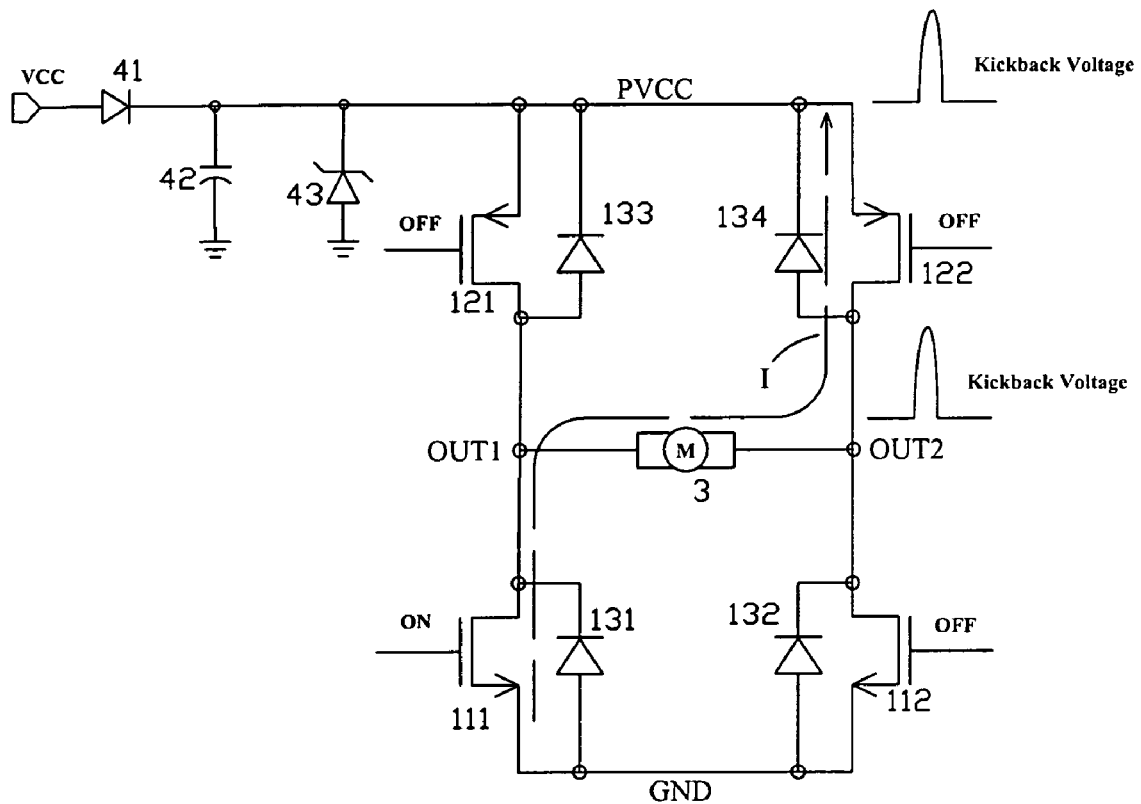
FIG. 4 shows current flowing from a first transistor to a fourth transistor via OUT1, load, and OUT2 when first transistor is on and second, third, fourth transistors are off in the circuit of FIG. 1.
Figure 5:
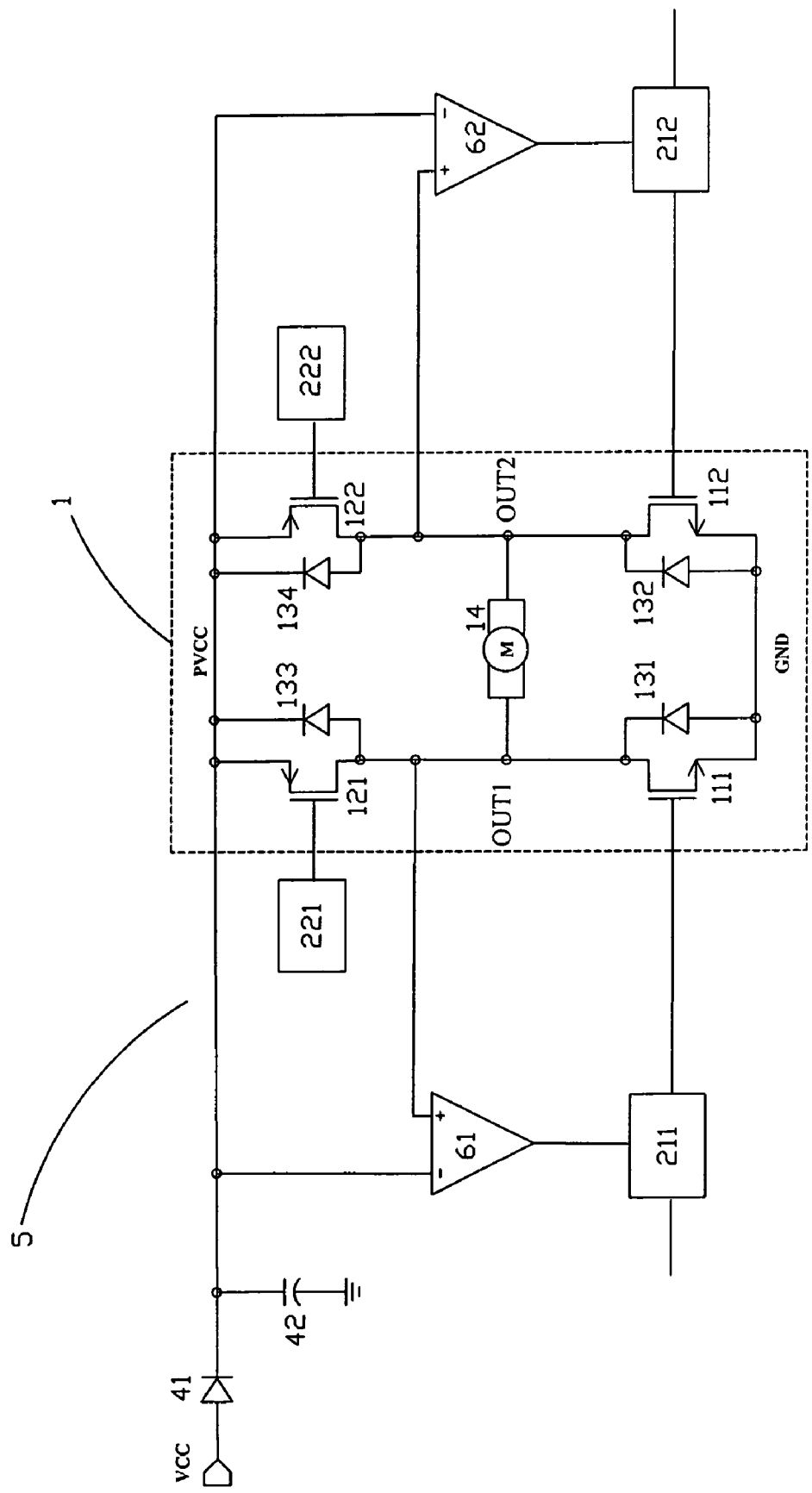
FIG. 5 is a circuit diagram of a first preferred embodiment of inductive kickback voltage reduction circuit according to the invention.
Figure 6:
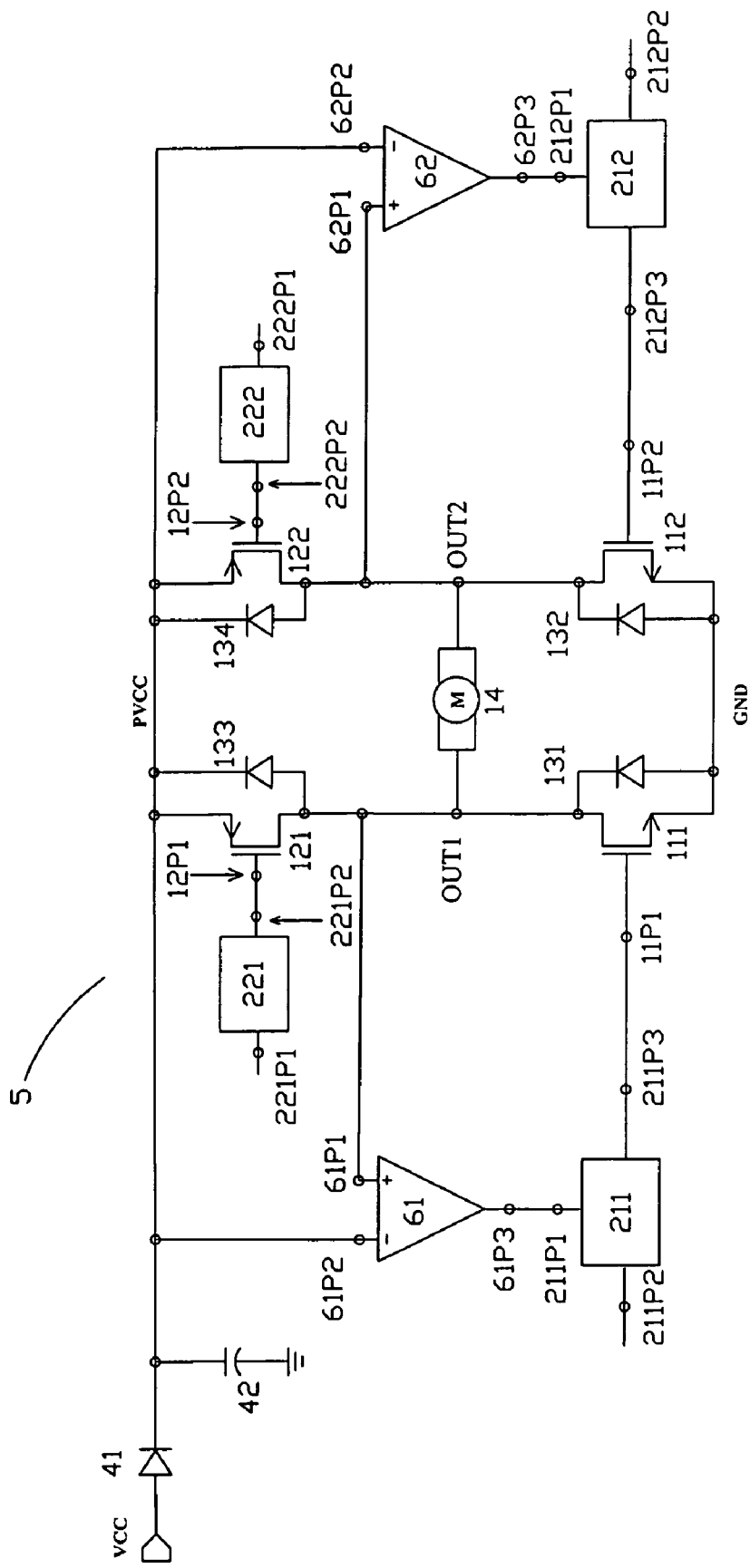
FIG. 6 is a detailed circuit diagram of FIG. 5.
Figure 7:
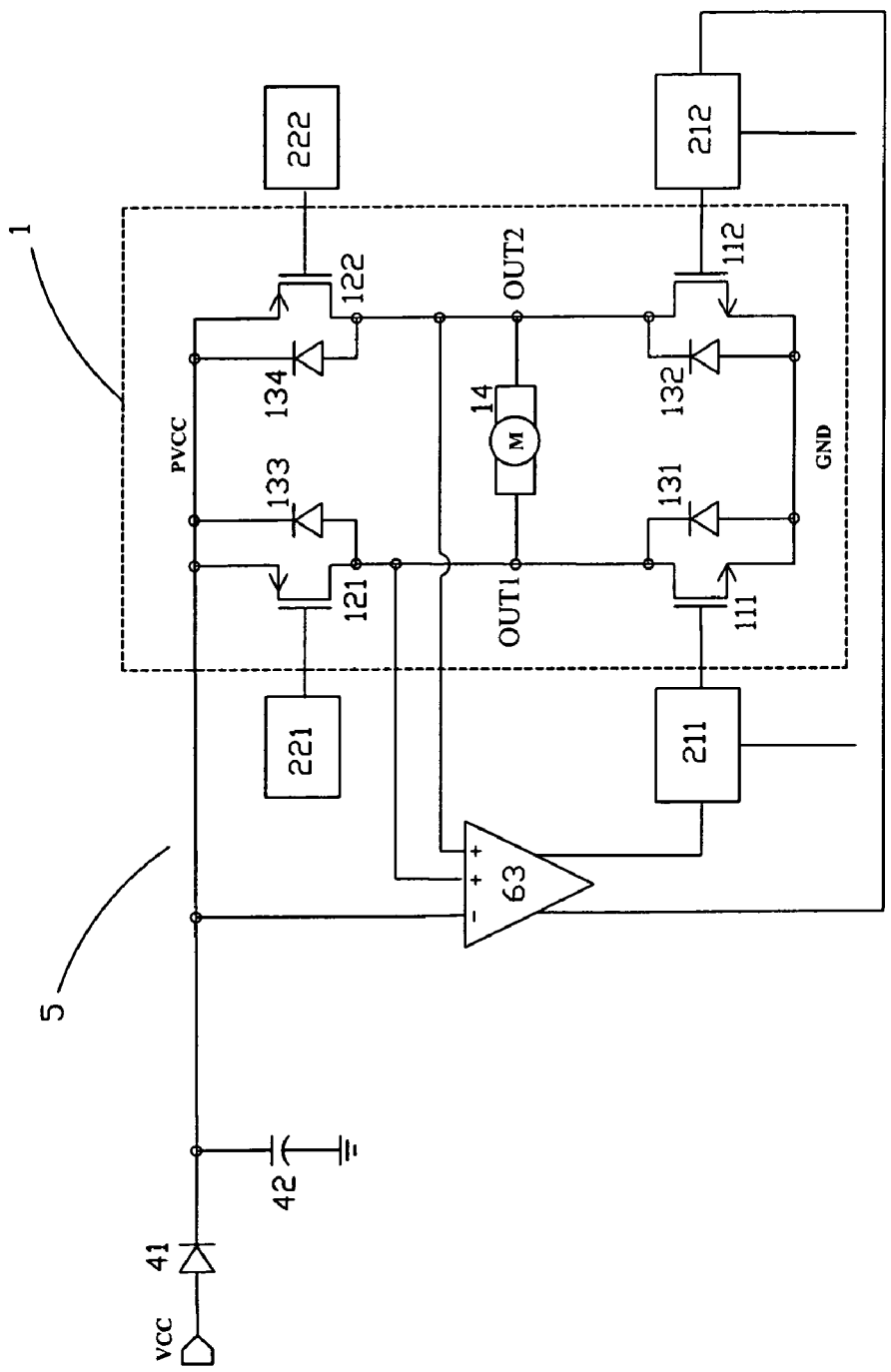
FIG. 7 is a circuit diagram of a second preferred embodiment of inductive kickback voltage reduction circuit according to the invention.
Figure 8:
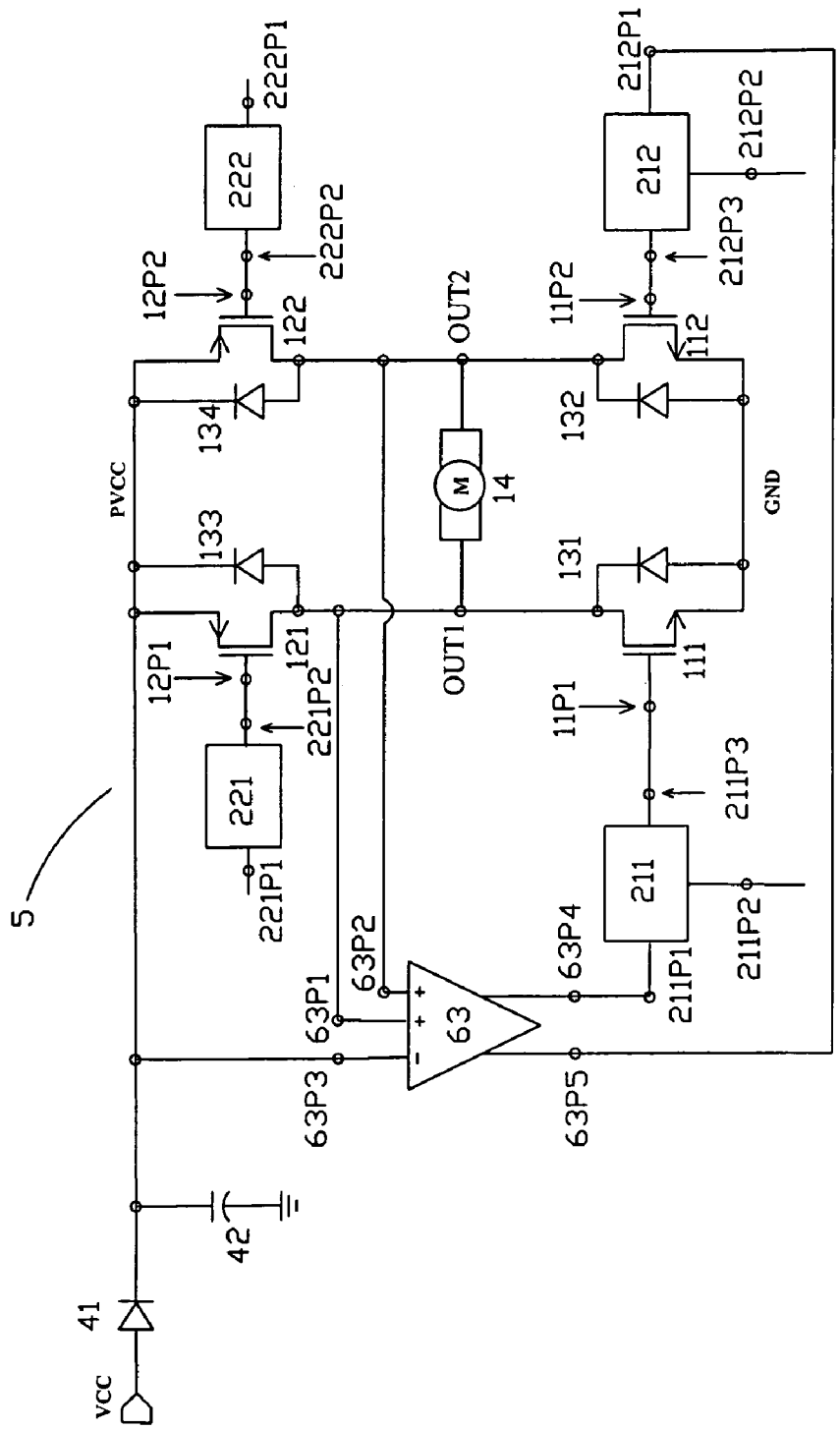
FIG. 8 is a detailed circuit diagram of FIG. 7.

Referring to FIGS. 5 and 6, a drive circuit for reducing kickback voltage generated in an inductive load in accordance with a first preferred embodiment of the invention is shown. The drive circuit 5 comprises an H-shaped transistor assembly 1, first and second comparators 61, 62; and first, second, third, and fourth logic controls 211, 212, 221, 222. The first comparator 61 comprises a positive input 61P1, a negative input 61P2, and an output 61P3. The second comparator 62 comprises a positive input 62P1, a negative input 62P2, and an output 62P3. The first logic control 211 comprises first and second inputs 211P1, 211P2 and an output 211P3. The second logic control 212 comprises first and second inputs 212P1, 212P2 and an output 212P3. The third logic control 221 comprises an input 221P1 and an output 221P2. The fourth logic control 222 comprises an input 222P1 and an output 222P2.

The H-shaped transistor assembly 1 comprises first, second, third, and fourth inputs 11P1, 11P2, 12P1, and 12P2; two outputs OUT1, OUT2; an internal power source PVCC as a reference potential input; a ground GND; and first, second, third, fourth transistors (e.g., field-effect transistors (FETs)) 111, 112, 121, 122 in which the first, third transistors 111, 121 are connected in series, the second, fourth transistors 112, 122 are connected in series, and the series connected transistors 111, 121 are connected in parallel to the series connected transistors 112, 122 (i.e., connected between PVCC and GND). A first diode 131 is interconnected source and drain of the first transistor 111. A second diode 132 is interconnected source and drain of the second transistor 112. A third diode 133 is interconnected source and drain of the third transistor 121. A fourth diode 134 is interconnected source and drain of the fourth transistor 122. Gate of the first transistor 111 is connected to the first input 11P1. Gate of the second transistor 112 is connected to the first input 11P2. Gate of the third transistor 121 is connected to the first input 12P1. Gate of the fourth transistor 122 is connected to the first input 12P2. Drain of the fourth transistor 122 is connected to OUT2. Drain of the third transistor 121 is connected to OUT1. Drain of the second transistor 112 is connected to OUT2.

Drain of the first transistor 111 is connected to OUT1. Sources of the first, second transistors 111, 112 are connected to GND. Sources of the third, fourth transistors 121, 122 are connected to PVCC.

An inductive load (i.e., direct current motor) 14 has two outputs connected to OUT1, OUT2 respectively in which OUT1 is connected to drains of the first, third transistors 111, 121 and OUT2 is connected to drains of the second, fourth transistors 112, 122 respectively. The positive input 61P1, the negative input 61P2, and the output 61P3 of the first comparator 61 are connected to OUT1, PVCC, and the first input 211P1 of the first logic control 211 respectively. The positive input 62P1, the negative input 62P2, and the output 62P3 of the second comparator 62 are connected to OUT2, PVCC, and the first input 212P1 of the second logic control 212 respectively. The output 211P3 of the first logic control 211 is connected to the first input 11P1. The output 212P3 of the second logic control 212 is connected to the second input 11P2. The output 221P2 of the third logic control 221 is connected to the third input 12P1. The output 222P2 of the fourth logic control 222 is connected to the fourth input 12P2. A capacitor 42 is interconnected PVCC and GND for storing a portion of electric charge (i.e., recirculation current) when kickback voltage is generated. A Schottky Barrier Diode (SBD) 41 is interconnected power supply VCC and PVCC and is adapted to prevent reverse current from damaging power supply VCC.

The characteristics of the first preferred embodiment of the invention are the provision of first and second comparators 61, 62 which will be discussed in detail below by describing the operation of the drive circuit 5.

Initially, the third transistor 121 is conducted by the third logic control 221, the second transistor 112 is conducted by the second logic control 212, the fourth transistor 122 is cut off by the fourth logic control 222, and the first transistor 111 is cut off by the first logic control 211 respectively so that current can flow from the third transistor 121 to the second transistor 112 via OUT1, the inductive load 14, and OUT2.

In response to cutting off the third transistor 121 by the third logic control 221, cutting off the second transistor 112 by the second logic control 212, conducting the fourth transistor 122 by the fourth logic control 222, and conducting the first transistor 111 by the first logic control 211 respectively, the current flows from the first transistor 111 to the fourth transistor 122 via OUT1, the inductive load 14, and OUT2 to increase voltage of OUT2 until a kickback voltage is generated.

In response to the generation of the kickback voltage (i) the positive input 61P1 of the first comparator 61 may sense the kickback voltage to invert a polarity of an output signal of the first comparator 61, the output signal feeding to the first logic control 211 is adapted to combine with other control signals fed thereto to generate a first control signal, the first control signal is adapted to conduct the first transistor 111 so that the kickback voltage can be reduced; and (ii) the positive input 62P1 of the second comparator 62 may sense the kickback voltage to invert a polarity of an output signal of the second comparator 62, the output signal feeding to the second logic control 212 is adapted to combine with other control signals fed thereto to generate a second control signal, the second control signal is adapted to conduct the second transistor 112 so that the kickback voltage can be further reduced.

In short, it is possible of reducing kickback voltage by consuming electrical power by flowing current to ground through the first, second transistors 111, 112.

The positive input 61P1 of the first comparator 61 and the positive input 62P1 of the second comparator 62 are adapted to sense the generation of kickback voltage in response to different potential levels of power supply VCC. As a result, the kickback voltage can be effectively controlled (i.e., reduced)

The logic controls 211, 212, 221, 222 are adapted to generate drive signals to activate the load 14 through the third, second transistors 121, 112 or first, fourth transistors 111, 122, and generate quiescent current control signals to prevent the transistors at the either side of the H-shaped transistor assembly 1 (i.e., either first, third transistors 111, 121 or second, fourth transistors 112, 122) from conducting at the same time. Moreover, as stated above each of the logic controls 211, 212 is adapted to combine control signal from first comparator 61 or second comparator 62 with other control signals fed thereto for generating a kickback voltage reduction control signal which is adapted to conduct the first transistor 111 or second transistor 112. Chip size thus can be reduced significantly as transistors 111, 112 having the capability of permitting a very large current to flow through.

Referring to FIGS. 7 to 10 and 13, a drive circuit 5 for reducing kickback voltage generated in an inductive load in accordance with a second preferred embodiment of the invention is shown. The characteristics of the second preferred embodiment are detailed below. The drive circuit 5 comprises an H-shaped transistor assembly 1; a comparator 63; and first, second, third, and fourth logic controls 211, 212, 221, 222. The comparator 63 comprises a first positive input 63P1, a second positive input 63P2, a negative input 63P3, a first output 63P4, and a second output 63P5. The first logic control 211 comprises first and second inputs 211P1, 211P2 and an output 211P3. The second logic control 212 comprises first and second inputs 212P1, 212P2 and an output 212P3. The third logic control 221 comprises an input 221P1 and an output 221P2. The fourth logic control 222 comprises an input 222P1 and an output 222P2.

The H-shaped transistor assembly 1 comprises first, second, third, and fourth inputs 11P1, 11P2, 12P1, and 12P2; two outputs OUT1, OUT2; an internal power source PVCC as a reference potential input; a ground GND; and first, second, third, fourth transistors 111, 112, 121, 122 in which the first, third transistors 111, 121 are connected in series, the second, fourth transistors 112, 122 are connected in series, and the series connected transistors 111, 121 are connected in parallel to the series connected transistors 112, 122 (i.e., connected between PVCC and GND). A first diode 131 is interconnected source and drain of the first transistor 111. A second diode 132 is interconnected source and drain of the second transistor 112. A third diode 133 is interconnected source and drain of the third transistor 121. A fourth diode 134 is interconnected source and drain of the fourth transistor 122. Gate of the first transistor 111 is connected to the first input 11P1. Gate of the second transistor 112 is connected to the first input 11P2. Gate of the third transistor 121 is connected to the first input 12P1. Gate of the fourth transistor 122 is connected to the first input 12P2. Drain of the fourth transistor 122 is connected to OUT2. Drain of the third transistor 121 is connected to OUT1. Drain of the second transistor 112 is connected to OUT2. Drain of the first transistor 111 is connected to OUT1. Sources of the first, second transistors 111, 112 are connected to GND. Sources of the third, fourth transistors 121, 122 are connected to PVCC.

An inductive load (i.e., direct current motor) 14 has two outputs connected to OUT1, OUT2 respectively in which OUT1 is connected to drains of the first, third transistors 111, 121 and OUT2 is connected to drains of the second, fourth transistors 112, 122. The characteristic of the second preferred embodiment of the invention is the provision of the comparator 63 as detailed below.

The first positive input 63P1, the second positive input 63P2, the negative input 63P3, the first negative input 63P4, and the second negative input 63P5 of the comparator 63 are connected to drain of the third transistors 121 (i.e., OUT1), OUT2, PVCC, the first input 211P1 of the first logic control 211, and the first input 212P1 of the second logic control 212 respectively. Thus, the comparator 63 can sense the generation of kickback voltage. PVCC is taken as a reference potential input. Output control signal at the first output 63P4 of the comparator 63 is fed to the first logic control 211 to combine with other control signals fed thereto for generating a kickback voltage reduction control signal which is adapted to conduct the first transistor 111. Output control signal at the second output 63P5 of the comparator 63 is fed to the second logic control 212 to combine with other control signals fed thereto for generating a kickback voltage reduction control signal which is adapted to conduct the second transistor 112. Thus, it is possible of reducing kickback voltage by consuming electrical power by flowing current to ground via the first, second transistors 111, 112.

The output 211P3 of the first logic control 211 is connected to the first input 11P1. The output 212P3 of the second logic control 212 is connected to the second input 11P2. The output 221P2 of the third logic control 221 is connected to the third input 12P1. The output 222P2 of the fourth logic control 222 is connected to the fourth input 12P2. A capacitor 42 is interconnected PVCC and GND for storing a portion of electric charge (i.e., recirculation current) when kickback voltage is generated. A Schottky Barrier Diode (SBD) 41 is interconnected power supply VCC and PVCC and is adapted to prevent reverse current from damaging power supply VCC.

The drive circuit 5 operates as follows: Initially the third transistor 121 is conducted by the third logic control 221, the second transistor 112 is conducted by the second logic control 212, the fourth transistor 122 is cut off by the fourth logic control 222, and the first transistor 111 is cut off by the fourth logic control 211 respectively. Thus, current flows from the third transistor 121 to the second transistor 112 via OUT1, an inductive load (i.e., motor) 14, and OUT2.

In response to phase changes by cutting off the third transistor 121 by the third logic control 221, by cutting off the second transistor 112 by the second logic control 212, by conducting the fourth transistor 122 by the fourth logic control 222, and by conducting the first transistor 111 by the first logic control 211 respectively, recirculation current flows from the first transistor 111 to the fourth transistor 122 via OUT1, the load 14, and OUT2. Voltage at OUT2 increases continuously until it reaches the value of a kickback voltage. The second positive input 63P2 of the comparator 63 then senses the kickback voltage at OUT2. As such, a polarity of either output signal of the comparator 63 inverts. That is, the second output 63P5 of the comparator 63 generates an output control signal which is fed to the second logic control 212 to combine with other control signals fed thereto for generating a kickback voltage reduction control signal which is adapted to conduct the second transistor 112 by feeding to the gate terminal thereof (i.e., connected to output 212P3 of the second logic control 212). Eventually, current flows from OUT2 to the ground GND via the conducted second transistor 112. Voltage at OUT2 remains at the level of kickback voltage so as to completely discharge electric charge (i.e., current) in the load 14. Thereafter, voltage at OUT2 decreases to invert the polarity of output signal of the comparator 63. At this time, the drive circuit 5 is disabled. Again, states of the transistors 111, 112, 121, 122 are determined by the logic controls 211, 212, 221, 222 respectively.

Figure 9:
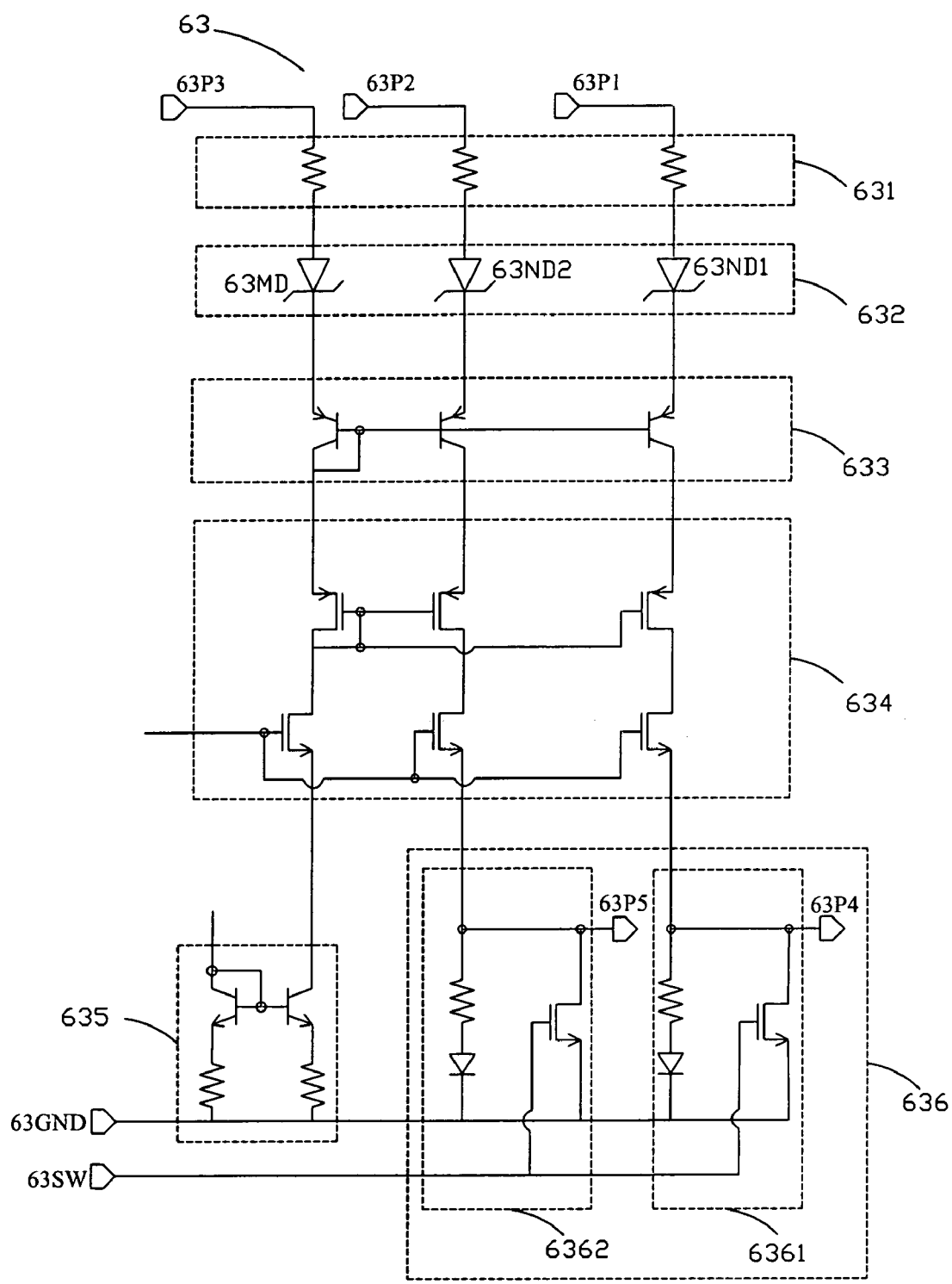
FIG. 9 is a detailed circuit diagram of the comparator of FIG. 7.
Figure 10:
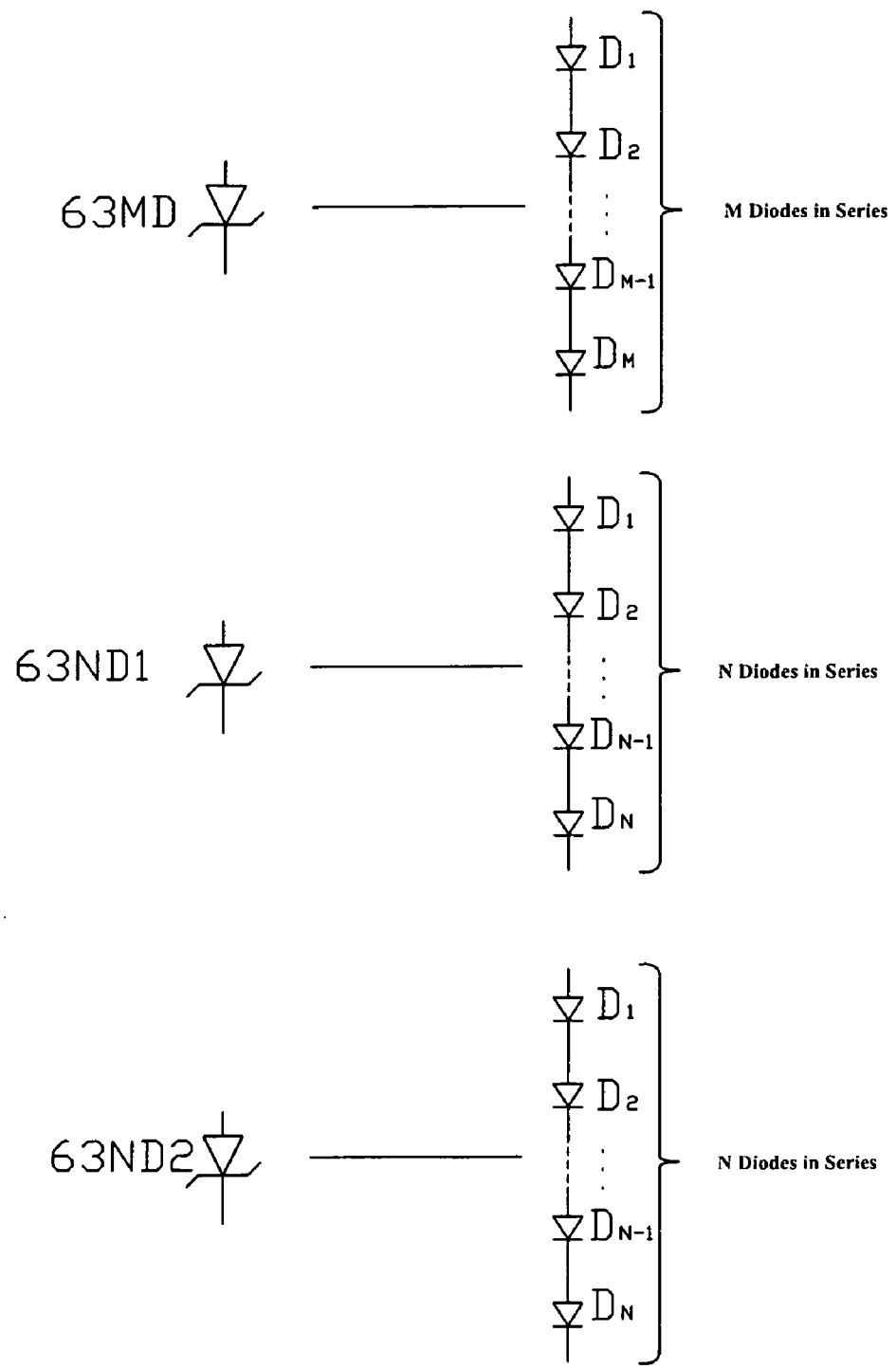
FIG. 10 shows details of the provided adjustment module of FIG. 9.
Figure 11:
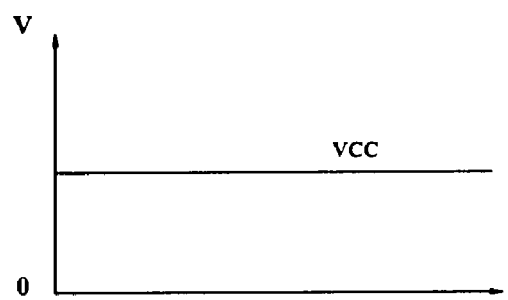
FIG. 11 depicts three waveform graphs showing kickback voltage reduction in inductive load according to the conventional drive circuit for reducing kickback voltage generated in an inductive load where a Schottky Barrier Diode (SBD) is interconnected the power supply VCC and PVCC.
Figure 11:
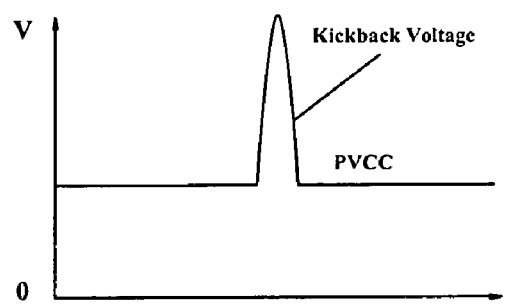
Figure 11:
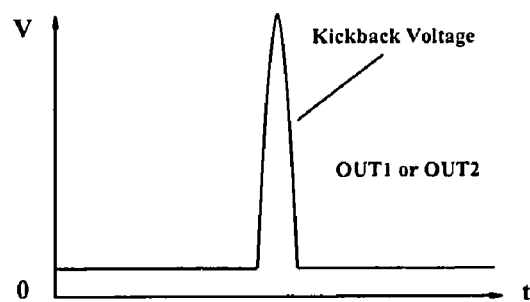
Figure 12:
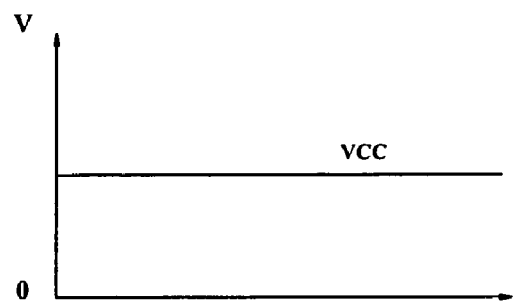
FIG. 12 depicts three waveform graphs showing kickback voltage reduction according to the conventional drive circuit for reducing kickback voltage where an additional Zener diode is interconnected PVCC and ground.
Figure 12:
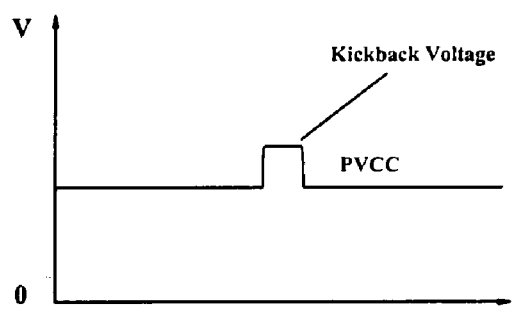
Figure 12:
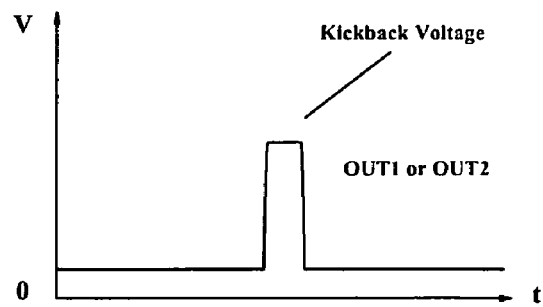

Referring to FIGS. 9 and 10, the comparator 63 comprises a current limiting module 631, a voltage adjustment module 632, a sensor module 633, a high voltage module 634, a bias module 635, and an output switching module 636 which has two terminals connected to ground 63GND and an output enable terminal 63SW respectively. The output of the current limiting module 631 is connected to the voltage adjustment module 632. The output of the voltage adjustment module 632 is connected to the sensor module 633. The output of the sensor module 633 is connected to the high voltage module 634. The output of the high voltage module 634 is connected to both the bias module 635 and the output switching module 636.

The inputs 63P1, 63P2, 63P3 of the comparator 63 are connected to the current limiting module 631. The output switching module 636 comprises a first switch 6361 connected to the first output 63P4 of the comparator 63 and a second switch 6362 connected to the second output 63P5 of the comparator 63 respectively. Ground terminals of the bias module 635 and the output switching module 636 are connected to ground 63GND. The output enable terminal 63SW is connected to the output switching module 636.

The current limiting module 631 comprises three parallel resistors (not numbered) for decreasing input current. This has the benefits of protecting components of the drive circuit 5 and increasing electrostatic discharge (ESD) capability of the drive circuit 5. The voltage adjustment module 632 comprises first, second, third diode assemblies 63MD, 63ND1, 63ND2 in which each of the first, second, third diode assemblies 63MD, 63ND1, 63ND2 comprises N or M diodes connected in series where N is a number greater than 1 and M is a number greater than 1 respectively (see FIG. 10). Input offset voltage can be set by increasing or decreasing the number of diodes being connected in series. The input offset voltage will cause the comparator 63 to invert polarity of output signal before the generation of kickback voltage if M is greater than N. But time required to consume current flowing through the load 14 will be prolonged if N is much less than M.

The sensor module 633 comprises a plurality of parallel transistors (not numbered) for sensing kickback voltage when it generates. The high voltage module 634 comprises a plurality of transistors (not numbered) in which one group of transistors has a common gate and the other group of transistors has another common gate so that other components of the drive circuit 5 can operate normally in a high voltage operating environment. The high voltage module 634 can be omitted if a circuit is designed to operate in low voltage operating environment. The bias module 635 is implemented as a current mirror bias transistor structure for supplying bias current to the comparator 63.

Each of the first and second switches 6361, 6362 is comprised of a resistor and a diode in series and a transistor in parallel thereto. The first and second switches 6361, 6362 aim at setting a logic high or low based on the flowing current. Also, the diode in either switch can shorten response time with respect to kickback voltage when it generates. The transistor in either switch acts as a switch for stopping the generation of output control signal at either first output 63P4 or second output 63P5 when the drive circuit 5 is disabled. Otherwise, the drive circuit 5 may interfere with the logic controls 211, 212. The gate of either switch is connected to the output enable terminal 63SW.

Figure 13:
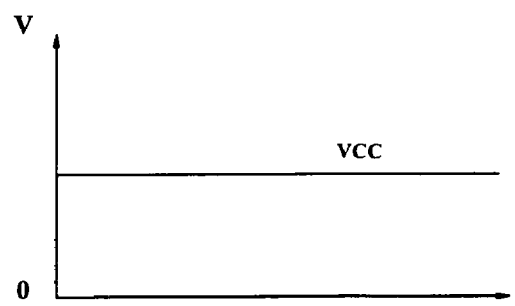
FIG. 13 depicts three waveform graphs showing kickback voltage reduction according to the invention.
Figure 13:
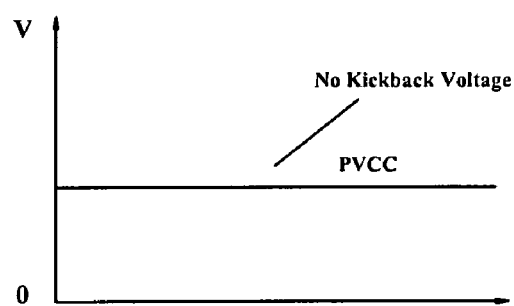
Figure 13:
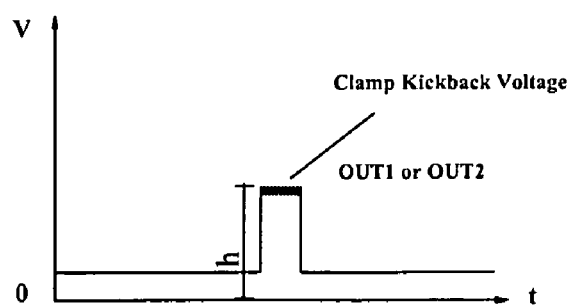

Referring to FIG. 13, three waveform graphs show inductive load kickback voltage reduction according to the invention. In detail, the upper graph represents the curve of VCC. The intermediate graph represents the curve of PVCC when kickback voltage is generated. The lower graph represents the curve of OUT1 or OUT2 when the drive circuit 5 enables to clamp down the voltage of OUT1 or OUT2 in response to kickback voltage. In detail, voltage of OUT1 or OUT2 increases until it reaches the set value h of kickback voltage. Then output signals are generated at the first output 63P4 and the second output 63P5 of the comparator 63 respectively. Therefore, both transistors 111, 112 are conducted. Further, voltage at OUT2 maintains at the voltage (i.e., value h of kickback voltage) by forming a loop comprising OUT2, the comparator 63, the second logic control 212, and the second transistor 112. Furthermore, voltage at OUT1 maintains at the voltage (i.e., value h of kickback voltage) by forming a loop comprising OUT1, the comparator 63, the first logic control 211, and the first transistor 111. In addition, the input offset voltage will cause the comparator 63 to invert the polarity of output signal before the generation of kickback voltage if M is greater than N. As a result, PVCC is not adversely affected by kickback voltage via diode 134 or 133.

While the invention herein disclosed has been described by means of specific embodiments, numerous modifications and variations could be made thereto by those skilled in the art without departing from the scope and spirit of the invention set forth in the claims.

What is claimed is:

1. A drive circuit (5) for an inductive load (14) having a first output (OUT1) and a second output (OUT2), comprising:

an internal power source (PVCC) as a reference potential connected to a power source (VCC) via a Schottky Barrier Diode (SBD) 41 and ground (GND) via a capacitor (42) respectively;

first and second comparators (61, 62) wherein the first comparator (61) comprises a positive input (61P1) connected to the first output (OUT1), a negative input (61P2) connected to the internal power source (PVCC), and an output (61 P3), and the second comparator (62) comprises a positive input (62P1) connected to the second output (OUT2), a negative input (62P2) connected to the internal power source (PVCC), and an output (62P3);

first, second, third, fourth transistors (111, 112, 121, 122) wherein the first transistor (111) has a source terminal connected to ground (GND) and a drain terminal connected to the first output (OUT1), the second transistor (112) has a source terminal connected to ground (GND) and a drain terminal connected to the second output (OUT2), the third transistor (121) has a source terminal connected to the internal power source (PVCC) and a drain terminal connected to the first output (OUT1), and the fourth transistor (122) has a source terminal connected to the internal power source (PVCC), and a drain terminal connected to the second output (OUT2);

a first diode (131) having an anode connected to the source terminal of the first transistor (111), and a cathode connected to the drain terminal of the first transistor (111);

a second diode (132) having an anode connected to the source terminal of the second transistor (112), and a cathode connected to the drain terminal of the second transistor (112);

a third diode (133) having an anode connected to the drain terminal of the third transistor (121), and a cathode connected to the source terminal of the third transistor (121);

a fourth diode (134) having an anode connected to the drain terminal of the fourth transistor (122), and a cathode connected to the source terminal of the fourth transistor (122); and first, second, third, and fourth logic controls (211, 212, 221, 222) wherein the first logic control (211) comprises a first input (211P1), a second input (211P2) connected to the output (61P3) of the first comparator (61) and an output (211P3) connected to a gate terminal of the first transistor (111); the second logic control (212) comprises a first input (212P1) connected to the output (62P3) of the second comparator (62), and a second input (212P2), and an output (212P3) connected to a gate terminal of the second transistor (112); the third logic control (221) comprises an input (221P1) and an output (221P2) connected to a gate terminal of the third transistor (121); and the fourth logic control (222) comprises an input (222P1) and an output (222P2) connected to a gate terminal of the fourth transistor (122), wherein the third transistor (121) is conducted by the third logic control (221), the second transistor (112) is conducted by the second logic control (212), the fourth transistor (122) is cut off by the fourth logic control (222), and the first transistor (111) is cut off by the first logic control (211) respectively so that current flows from the third transistor (121) to the second transistor (112) via the first output (OUT1), the inductive load (14), and the second output (OUT2);

wherein in response to cutting off the third transistor (121) by the third logic control (221), cutting off the second transistor (112) by the second logic control (212), conducting the fourth transistor (122) by the fourth logic control (222), and conducting the first transistor (111) by the first logic control (211) respectively, the current flows from the first transistor (111) to the fourth transistor (122) via the first output (OUT1), the inductive load (14), and the second output (OUT2) to increase voltage of the second output (OUT2) until a kickback voltage is generated; and wherein in response to the kickback voltage (i) the positive input (61P1) of the first comparator (61) senses the kickback voltage to invert a polarity of an output signal of the first comparator (61), the output signal sending to the first logic control (211) combines with other signals sent thereto to generate a first control signal, the first control signal conducts the first transistor (111) so as to reduce the kickback voltage; and (ii) the positive input (62P1) of the second comparator (62) senses the kickback voltage to invert a polarity of an output signal of the second comparator (62), the output signal sending to the second logic control (212) combines with other signals sent thereto to generate a second control signal, the second control signal conducts the second transistor (112) so as to further reduce the kickback voltage.

2. A drive circuit (5) for an inductive load (14) having a first output (OUT1) and a second output (OUT2), comprising:

an internal power source (PVCC) as a reference potential connected to a power source (VCC) via a Schottky Barrier Diode (SBD) 41 and ground (GND) via a capacitor (42) respectively;

a comparator (63) comprising a first positive input (63P1) connected to the first output (OUT1), a second positive input (63P2) connected to the second output (OUT2), a negative input (63P3) connected to the internal power source (PVCC), a first output (63P4), and a second output (63P5);

first, second, third, fourth transistors (111, 112, 121, 122) wherein the first transistor (111) has a source terminal connected to ground (GND) and a drain terminal connected to the first output (OUT1), the second transistor (112) has a source terminal connected to ground (GND) and a drain terminal connected to the second output (OUT2), the third transistor (121) has a source terminal connected to the internal power source (PVCC) and a drain terminal connected to the first output (OUT1), and the fourth transistor (122) has a source terminal connected to the internal power source (PVCC), and a drain terminal connected to the second output (OUT2);

a first diode (131) having an anode connected to the source terminal of the first transistor (111), and a cathode connected to the drain terminal of the first transistor (111);

a second diode (132) having an anode connected to the source terminal of the second transistor (112), and a cathode connected to the drain terminal of the second transistor (112);

a third diode (133) having an anode connected to the drain terminal of the third transistor (121), and a cathode connected to the source terminal of the third transistor (121);

a fourth diode (134) having an anode connected to the drain terminal of the fourth transistor (122), and a cathode connected to the source terminal of the fourth transistor (122); and first, second, third, and fourth logic controls (211, 212, 221, 222) wherein the first logic control (211) comprises a first input (211P1) connected to the first output (63P4) of the first comparator (63), a second input (211P2), and an output (211P3) connected to a gate terminal of the first transistor (111); the second logic control (212) comprises a first input (212P1) connected to the second output (62P5) of the comparator (63), and a second input (212P2), and an output (212P3) connected to a gate terminal of the second transistor (112); the third logic control (221) comprises an input (221P1) and an output (221P2) connected to a gate terminal of the third transistor (121); and the fourth logic control (222) comprises an input (222P1) and an output (222P2) connected to a gate terminal of the fourth transistor (122), wherein the third transistor (121) is conducted by the third logic control (221), the second transistor (112) is conducted by the second logic control (212), the fourth transistor (122) is cut off by the fourth logic control (222), and the first transistor (111) is cut off by the first logic control (211) respectively so that current flows from the third transistor (121) to the second transistor (112) via the first output (OUT1), the inductive load (14), and the second output (OUT2);

wherein in response to cutting off the third transistor (121) by the third logic control (221), cutting off the second transistor (112) by the second logic control (212), conducting the fourth transistor (122) by the fourth logic control (222), and conducting the first transistor (111) by the first logic control (211) respectively, the current flows from the first transistor (111) to the fourth transistor (122) via the first output (OUT1), the inductive load (14), and the second output (OUT2) to increase voltage of the second output (OUT2) until a kickback voltage is generated; and wherein in response to the kickback voltage the second positive input (63P2) of the comparator (63) senses the kickback voltage to invert a polarity of each of first and second output signals of the comparator (63) such that (i) the first output signal sending from the first output (63P4) of the comparator (63) to the first logic control (211) combines with other signals sent thereto to generate a first control signal which conducts the first transistor (111) so as to reduce the kickback voltage; and (ii) the second output signal sending from the second output (63P5) of the comparator (63) to the second logic control (212) combines with other signals sent thereto to generate a second control signal which conducts the second transistor (112) so as to further reduce the kickback voltage.

3. The drive circuit (5) of claim 2, wherein the comparator (63) comprises a current limiting module (631), a voltage adjustment module (632), a sensor module (633), a high voltage module (634), a bias module (635), and an output switching module (636); wherein the current limiting module (631), the voltage adjustment module (632), the sensor module (633), and the high voltage module (634) are connected in series; and wherein the bias module (635) is connected to the high voltage module (634) in series, and the output switching module (636) is connected to the high voltage module (634) in series.

4. The drive circuit (5) of claim 3, wherein the current limiting module (631) comprises a plurality of parallel resistors; the voltage adjustment module (632) comprises first, second, third diode assemblies (63MD, 63ND1, 63ND2) wherein the first diode assembly (63MD) comprises M diodes connected in series where M is a number greater than , and each of the second and the third diode assemblies (63ND1, 63ND2) comprises N diodes connected in series where N is a number greater than 1;

the sensor module (633) comprises a plurality of parallel transistors for sensing kickback voltage when it generates;

the high voltage module (634) comprises a plurality of fifth transistors having a first common gate terminal and a plurality of sixth transistors having a second common gate terminal;

the bias module (635) is a current mirror bias transistor structure for supplying bias current to the comparator (63); and the output switching module (636) comprises a first switch (6361) connected to the first output (63P4) of the comparator (63), a second switch (6362) connected to the second output (63P5) of the comparator (63), an output enable terminal (63SW) connected to each of the first and the second switches (6361, 6362), and ground (63GND) connected to the bias module (635) and each of the first and the second switches (6361, 6362).

* * * * *